United States Patent [19]
Gurney et al.

[11] Patent Number: 5,422,571
[45] Date of Patent: Jun. 6, 1995

[54] MAGNETORESISTIVE SPIN VALVE SENSOR HAVING A NONMAGNETIC BACK LAYER

[75] Inventors: Bruce A. Gurney, Santa Clara; David E. Heim, Redwood City; Haralambos Lefakis, San Jose; Omar U. Need, III, San Jose; Virgil S. Speriosu, San Jose; Dennis R. Wilhoit, Morgan Hill, all of Calif.

[73] Assignee: International Business Machines Corporation, Armonk, N.Y.

[21] Appl. No.: 14,981

[22] Filed: Feb. 8, 1993

[51] Int. Cl.$^6$ .................. G01R 33/02; H01L 43/08
[52] U.S. Cl. .................. 324/252; 360/113; 338/32 R
[58] Field of Search .......... 324/207.21, 252, 235; 360/113, 126; 338/32 R

[56] References Cited

U.S. PATENT DOCUMENTS

| | | | |
|---|---|---|---|
| 4,103,315 | 7/1978 | Hempstead et al. | 360/113 |
| 4,673,998 | 6/1987 | Souda et al. | 360/113 |
| 4,712,144 | 12/1987 | Klaassen | 360/67 |
| 4,949,039 | 8/1990 | Grunberg | 324/252 |
| 5,073,836 | 12/1991 | Gill et al. | 360/113 |
| 5,159,513 | 10/1992 | Dieny et al. | 360/113 |
| 5,251,088 | 10/1993 | Coutellier et al. | 324/252 |
| 5,287,238 | 2/1994 | Baumgart et al. | 324/252 |
| 5,301,079 | 4/1994 | Cain et al. | 360/113 |
| 5,329,413 | 7/1994 | Kondoh et al. | 360/113 |

FOREIGN PATENT DOCUMENTS

| | | |
|---|---|---|
| 0152000A2 | 8/1985 | European Pat. Off. |
| 0539213A1 | 4/1993 | European Pat. Off. |

OTHER PUBLICATIONS

D. A. Thompson et al., "Memory, Storage, and Related Applications", IEEE Trans. Mag. MAG-11, (1975), pp. 1039-1050.

B. Dieny et al., "Change in Conductance is the Funadamental Measure of Spin-Valve Magnetoresistance", Appl. Phys. Lett. 61 (17), 26 Oct. 1992, pp. 2111-2113.

*Primary Examiner*—Walter E. Snow
*Assistant Examiner*—Jay M. Patidar
*Attorney, Agent, or Firm*—Leslie G. Murray

[57] ABSTRACT

A magnetoresistive read sensor based on the spin valve effect in which a component of the read element resistance varies as the cosine of the angle between the magnetization directions in two adjacent magnetic layers is described. The sensor read element includes two adjacent ferromagnetic layers separated by a nonmagnetic metallic layer. A layer of nonmagnetic electrically conductive material is deposited adjacent to and in contact with one of the ferromagnetic layers, referred to as a filter layers to form a back or conduction layer which provides a low resistance path for conduction electrons transmitted through the adjacent filter layer. The thickness of the filter layer is selected such that it effectively blocks conduction electrons having spins antiparallel to the direction of magnetization in the filter layer while allowing conduction electrons with parallel spins to be transmitted through the layer into the adjacent back layer. The magnetization of the filter layer is free to rotate in response to an applied magnetic field thereby effectively varying the electrically resistance to conduction electrons in the back/filter layer. The thickness of the back layer is selected to optimize the sensor parameters being measured and is in a range of about 4.0 Å to 1000 Å.

47 Claims, 7 Drawing Sheets

MAGNETORESISTIVE SPIN VALVE SENSOR HAVING A NONMAGNETIC BACK LAYER

BACKGROUND OF THE INVENTION

The present invention relates generally to magnetic transducers for reading information signals recorded in a magnetic medium and, more particularly, to a magnetoresistive read transducer based on the spin valve effect wherein at least the magnetoresistive element sensitive to an applied magnetic field includes a back layer of a nonmagnetic, conducting material.

It is well known in the prior art to use a magnetic read transducer referred to as a magnetoresistive (MR) sensor or head for reading data from a magnetic storage medium surface at great linear densities. An MR sensor detects magnetic field signals through the resistance changes of a read element fabricated of a magnetic material as a function of the strength and direction of magnetic flux being sensed by the read element. These prior art MR sensors operate on the basis of the anisotropic magnetoresistive (AMR) effect in which a component of the read element resistance varies as the square of the cosine ($cos^2$) of the angle between the magnetization and the direction of sense current flow through the element. A more detailed description of the AMR effect can be found in "Memory, Storage, and Related Applications", D. A. Thompson et al., IEEE Trans. Mag. MAG-11, p. 1039 (1975).

More recently, a different, more pronounced magnetoresistance has been observed resulting from the effects of spin-dependent-scattering of conduction electrons in magnetic multilayered structures of the form $(F/NM)_n$ where F is a ferromagnetic metal and NM is a nonferromagnetic metal. This effect has been found in a variety of systems such as sputtered Fe/Cr, Co/Cu, or Co/Ru multilayers exhibiting strong antiferromagnetic coupling of the ferromagnetic layers, as well as in essentially uncoupled layered structures of the form (F/NM/F) in which the magnetization orientation in one of the ferromagnetic layers is fixed by exchange anisotropy. The physical origin of the magnetoresistance is the same in both types of structures: the application of a magnetic field causes a variation in the relative orientation of the magnetizations of adjacent ferromagnetic layers. The resistance of the structure changes as the alignment of the magnetizations changes from parallel to antiparallel. This mechanism produces a magnetoresistance that, for selected combinations of materials, is greater in magnitude than the AMR, and is referred to as the "spin valve" magnetoresistance (SVMR) or giant magnetoresistance (GMR).

U.S. Pat. No. 4,949,039 to Grunberg describes a layered magnetic structure which yields enhanced MR effects caused by antiparallel alignment of the magnetizations in the magnetic layers. As possible materials for use in the layered structure, Grunberg lists ferromagnetic transition metals and alloys, but does not indicate preferred materials from the list for superior MR signal amplitude. Grunberg further describes the use of antiferromagnetic-type exchange coupling to obtain the antiparallel alignment in which adjacent layers of ferromagnetic materials are separated by a thin nonmagnetic interlayer of chromium (Cr) or yttrium (Y), for example.

U.S. patent application Ser. No. 07/625,343 filed Dec. 11, 1990, now U.S. Pat. No. 5,206,590 assigned to the instant assignee, discloses an MR sensor in which the resistance between two uncoupled ferromagnetic layers is observed to vary as the cosine of the angle between the magnetizations of the two layers and which is independent of the direction of current flow through the sensor. This structure produces a magnetoresistance that is based on the spin valve effect and, for selected combinations of materials, is greater in magnitude than the AMR.

U.S. Pat. No. 5,159,513, issued Oct. 27, 1992, assigned to the instant assignee, discloses an MR sensor based on the above-described spin valve effect which includes two thin film layers of ferromagnetic material separated by a thin film layer of a non-magnetic metallic material wherein at least one of the ferromagnetic layers is of cobalt or a cobalt alloy. The magnetization of the one ferromagnetic layer is maintained perpendicular to the magnetization of the other ferromagnetic layer at zero externally applied magnetic field by exchange coupling to an antiferromagnetic layer.

In order to meet the requirement for ever increasing data storage densities in today's magnetic storage systems, it is required that the magnetic flux sensing elements in MR heads be fabricated in progressively thinner layers of ferromagnetic material. MR sensors utilizing ultrathin magnetic flux sensing layers, about 15 A, for example, exhibit degraded MR coefficients both for the conventional AMR sensors as well as for the more recent SVMR or GMR sensors.

SUMMARY OF THE INVENTION

In accordance with the principles of the present invention, an MR read sensor based on the spin valve effect comprises a layered structure formed on a suitable substrate including first and second thin film layers of a ferromagnetic material separated by a thin film layer of non-magnetic metallic material, wherein at least the first layer of ferromagnetic material is backed by a layer of a nonmagnetic electrically conducting material. The magnetization direction of the first layer of ferromagnetic material is substantially perpendicular to the magnetization direction of the second layer of ferromagnetic material at zero externally applied magnetic field. The magnetization direction in the second ferromagnetic layer is constrained or maintained ("pinned") in its direction by exchange coupling provided by an adjacent layer of antiferromagnetic material in physical contact with the second ferromagnetic layer. The direction of the magnetization in the first ("free") ferromagnetic layer is free to rotate in response to an externally applied magnetic field. A current source provides a sense current to the MR sensor which generates a voltage drop across the read element proportional to the variations in the resistance of the MR sensor due to the rotation of the magnetization in the free layer of ferromagnetic material as a function of the applied external magnetic field being sensed. The magnitude of the resistance change of the read element is a function of the cosine of the change of the angle between the direction of magnetization in the free layer and the direction of the magnetization in the fixed layer in response to an externally applied magnetic field such as that representative of a data bit stored in magnetic media.

BRIEF DESCRIPTION OF THE DRAWINGS

The foregoing and other objects, features and advantages of the present invention will be apparent from the following detailed description of the preferred embodiments of the invention, reference being made to the accompanying drawings, in which like reference numerals indicate like parts and in which.

DETAILED DESCRIPTION OF THE PREFERRED EMBODIMENTS

Figure 1:
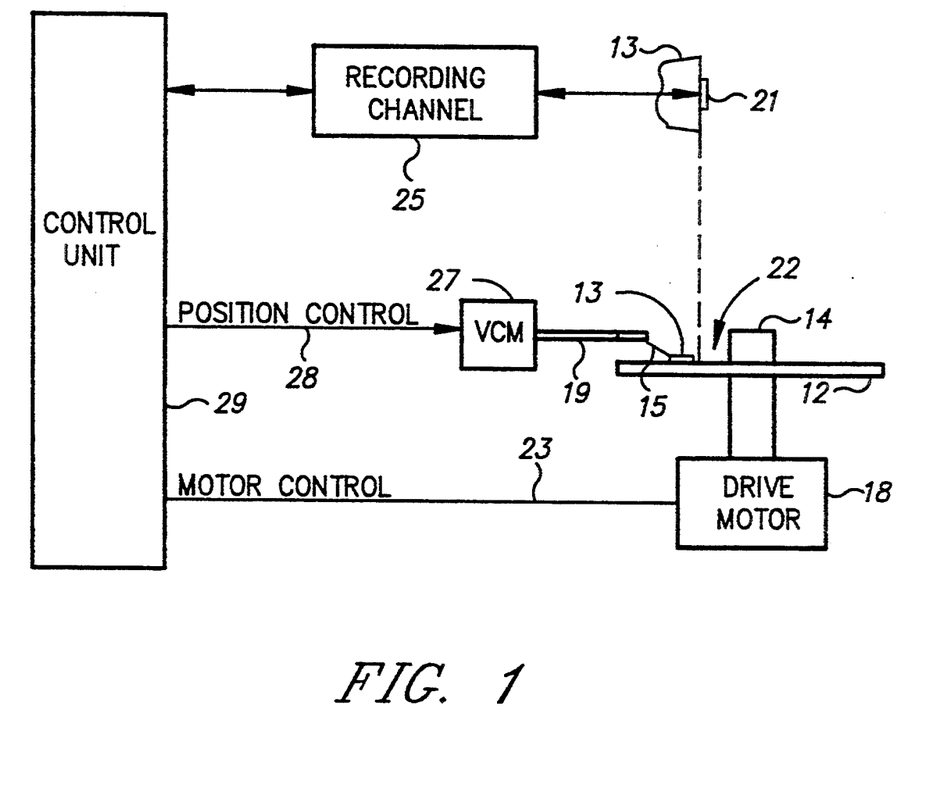
FIG. 1 is a simplified block diagram of a magnetic disk storage system embodying the present invention.

Referring now to FIG. 1, although the invention is described as embodied in a magnetic disk storage system as shown in FIG. 1, it will be apparent that the invention is also applicable to other magnetic recording systems such as a magnetic tape recording system, for example, and to magnetic random access memory systems wherein a magnetoresistive element serves as a bit cell, for example. At least one rotatable magnetic disk 12 is supported on a spindle 14 and rotated by a disk drive motor 18. The magnetic recording media on each disk is in the form of an annular pattern of concentric data tracks (not shown) on disk 12. Data bits are magnetically recorded in the data tracks.

At least one slider 13 is positioned on the disk 12, each slider 13 supporting one or more magnetic read/write transducers 21, typically referred to as read/write heads. As the disks rotate, the sliders 13 are moved radially in and out over the disk surface 22 so that the heads 21 may access different portions of the disk where desired data is recorded. Each slider 13 is attached to an actuator arm 19 by means of a suspension 15. The suspension 15 provides a slight spring force which biases the slider 13 against the disk surface 22. Each actuator arm 19 is attached to an actuator means 27. The actuator means as shown in FIG. 1 may be a voice coil motor (VCM), for example. The VCM comprises a coil moveable within a fixed magnetic field, the direction and velocity of the coil movements being controlled by the motor current signals supplied by a controller.

During operation of the disk storage system, the rotation of the disk 12 generates an air bearing between the slider 13 and the disk surface 22 which exerts an upward force or lift on the slider. The air bearing thus counterbalances the slight spring force of the suspension 15 and supports the slider 13 off and slightly above the disk surface by a small, substantially constant spacing during operation. As the disk 12 rotates, the data bits recorded in the data tracks of the magnetic media are moved under and past the magnetic read/write transducers 21. Magnetic fields representative of the data bits stored in the media are intercepted and detected by the magnetic read transducer.

The various components of the disk storage system are controlled in operation by control signals generated by control unit 29, such as access control signals and internal clock signals. Typically, the control unit 29 comprises logic control circuits, storage means and a microprocessor, for example. The control unit 29 generates control signals to control various system operations such as drive motor control signals on line 23 and head position and seek control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system, and the accompanying illustration of FIG. 1 are for representation purposes only. It should be apparent that disk storage systems may contain a large number of disks and actuators, and each actuator may support a number of sliders.

Figure 2:
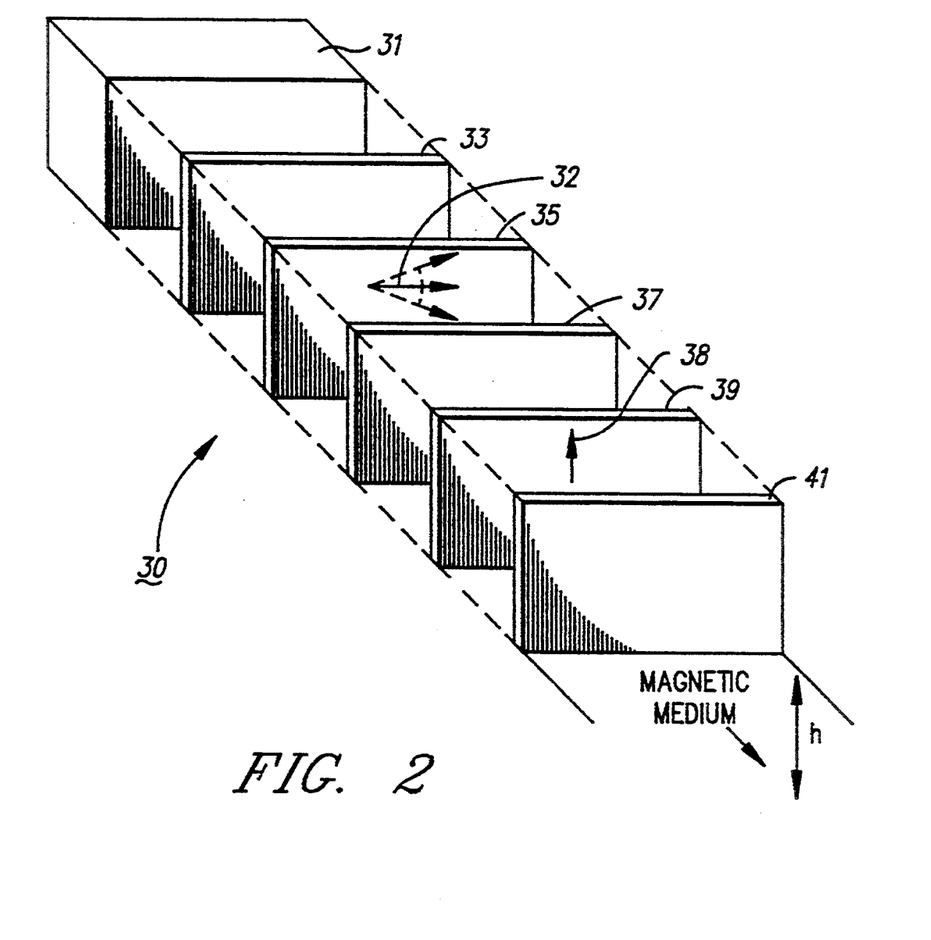
FIG. 2 is an exploded view in perspective of a preferred embodiment of the magnetoresistive sensor according to the principles of the present invention.

Referring now to FIG. 2, an MR spin valve sensor 30 according to the principles of the present invention comprises a suitable substrate 31 such as glass, ceramic or a semiconductor, for example, upon which is deposited a thin film layer 33 of a conductive, nonmagnetic or magnetic material, a first thin film layer 35 of soft ferromagnetic material, a thin film layer 37 of a non-magnetic metallic material and a second thin film layer 39 of ferromagnetic material. The first ferromagnetic layer 35 is formed directly on and in physical contact with the conduction layer 33 forming a bilayer. The magnetizations of the two layers 35, 39 of ferromagnetic material are oriented at an angle of about 90 degrees with respect to each other as indicated by arrows 32 and 38 in the absence of an externally applied magnetic field. In addition, the magnetization direction of the second layer 39 of ferromagnetic material is fixed or pinned in a preferred orientation as shown by the arrow 38. Thus, while the magnetization direction of the second ferromagnetic layer 39 remains fixed, the magnetization in the first layer 35 of ferromagnetic material is free to rotate its direction in response to an externally applied magnetic field (such as magnetic field has shown in FIG. 2), as shown by the dashed arrows on layer 35 in FIG. 2.

A thin film layer 41 of an exchange biasing material having relatively high electrical resistance is deposited in direct contact with the second thin film layer 39 of ferromagnetic material to provide a biasing field by exchange coupling. In the preferred embodiment layer 41 comprises a suitable antiferromagnetic material, preferably iron-manganese (FeMn) or nickel-manganese (NiMn), for example. Alternatively, the second ferromagnetic layer 39 can be pinned using a hard bias layer (not shown) or by other suitable methods as is known in the art.

An MR sensor based on the spin valve effect wherein the sensor read elements comprises the ferromagnetic/non-magnetic/ferromagnetic layered structure is described in greater detail in the above referenced patent application Ser. No. 07/625,343, now U.S. Pat. No. 5,026,590 hereby incorporated by reference as if fully set forth herein. The spin valve MR structure described therein comprises two ferromagnetic conducting layers separated by a nonmagnetic metallic (conducting) spacer layer. One of the ferromagnetic layers is maintained in a single magnetic domain state whose direction is fixed or pinned by exchange anisotropy with an adjacent antiferromagnetic layer. The magnetization of the other ferromagnetic layer (free layer) rotates its direction in response to applied magnetic fields. Magnetoresistance is observed by applying a magnetic field sufficient to change the direction of the free layer magnetization with respect to the pinned layer. In the present invention, the ferromagnetic layer comprising the free layer is replaced by a two-layer structure: the layer adjacent the nonmagnetic spacer layer 57 is a relatively thin ferromagnetic layer 35 (sometimes referred to as a "filter layer") and a conduction layer 33 (also referred to as a "back layer") behind or backing the ferromagnetic layer.

The GMR observed in magnetic materials is due primarily to a difference in mean free path for conduction electrons having spin parallel (lambda+) to the magnetization direction and for conduction electrons having spin antiparallel (lambda−) to the magnetization direction in the magnetic materials. In the present invention, the ferromagnetic layer 35 in the free layer 33,35 is of a thickness greater than lambda− and substantially less than lambda+. Thus, while a conduction electron having an antiparallel spin (minority carrier) will be effectively blocked (i.e., filtered out) by the filter layer 35, the filter layer 35 will be essentially transparent to a conduction electron having parallel spin (majority carrier). Majority and minority carriers (with respect to the direction of magnetization in the pinned layer 39) that originate in the pinned layer 39 are the carriers moving toward the filter layer 35 that are able to be scattered differently when the free layer 33,35 magnetization is rotated and that therefore lead to GMR. Those conduction electrons contributing to GMR that are moving in the opposite direction, from the filter layer 35 to the pinned layer 39, travel on the average the same direction and therefore will not be discussed. Similarly, for every majority carrier starting in the spacer layer 37 there is a minority carrier also starting at the same position with the same momentum, so that when the magnetization of the free layer 33,35 is rotated the sum of the mean free paths remains unchanged.

The GMR observed in the structures of the present invention may be discussed in terms of the change in conductance (delta G) rather than resistance because delta G has been shown to be the measurable macroscopic quantity most fundamentally related to the spin valve MR, see B. Dieny et al, "CHANGE IN CONDUCTANCE IS THE FUNDAMENTAL MEASURE OF SPIN-VALVE MAGNETORESISTANCE", *Appl. Phys. Lett* 61 (17), 26 October 1992, page 2111.

Considering then the conduction electrons emanating, i.e. scattered, from the pinned layer 39 into the spacer layer 37, whether the scattering is interfacial or bulk scattering, the minority carrier scattering near the pinned layer/spacer layer interface means the number of minority carriers crossing the spacer layer 37 and the distance they travel before their next scattering event is much smaller than for the majority. Viewed in this manner, the pinned layer 39 can be considered a spin-polarized conduction electron source for the rest of the spin valve structure. Carriers originating in the pinned layer 39 traverse the spacer layer 37, generally having a thickness much less than the mean free path for the electrons in the spacer layer material, and enter the filter layer 35. Majority carriers entering the filter layer will be transmitted through the filter layer to the back layer 33 where the carriers will travel on average an additional mean free path determined by the back layer material (lambda$_b$+). However, minority carriers will penetrate the filter layer 35 only a short distance before being scattered. Thus when a conductive material having a relatively low resistance (i.e., a long mean free path) is utilized for the back layer 33, a large value for the majority carrier conductance exists when the magnetization of the filter (free) layer 35 is parallel to the majority carrier spin. When the magnetization of the free layer 33,35 is rotated (antiparallel), the effective mean free path (i.e., conductance) of these conduction electrons will be radically reduced as a result of minority scattering in the filter layer 35.

Figure 3A:
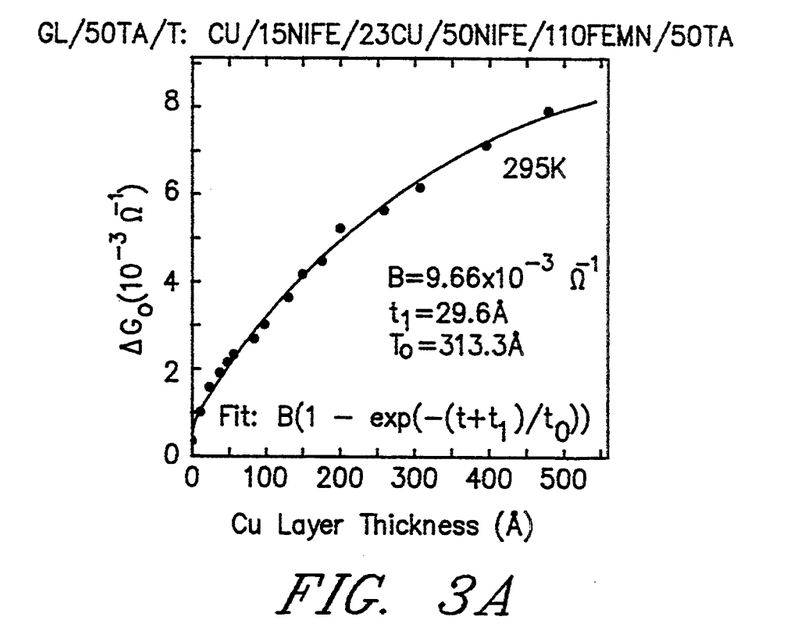
FIG. 3A is a graph which illustrates the change in sheet conductance as the free layer magnetization changes from parallel to antiparallel as a function of the back layer thickness for the magnetoresistive sensor shown in FIG. 2.
Figure 3B:
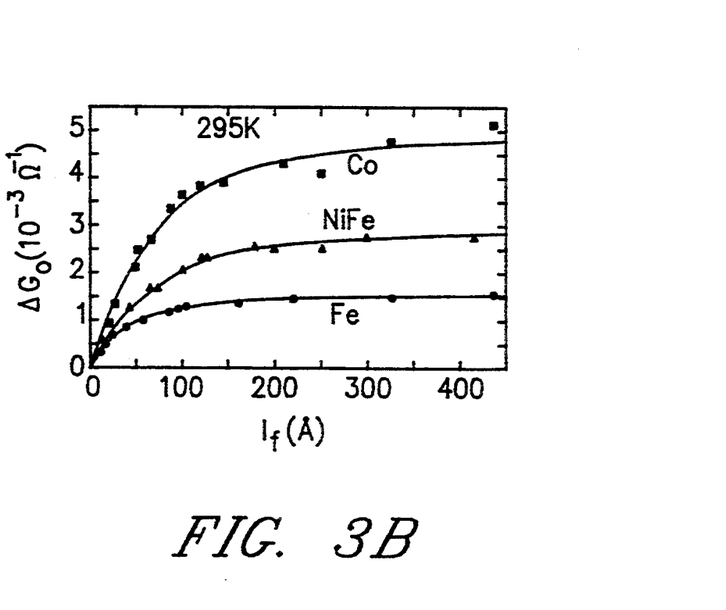
FIG. 3B is a graph which illustrates the change in sheet conductance as the free layer magnetization changes from parallel to antiparallel for spin valve MR sensors with no back layer for various ferromagnetic materials as a function of the free layer thickness.
Figure 4:
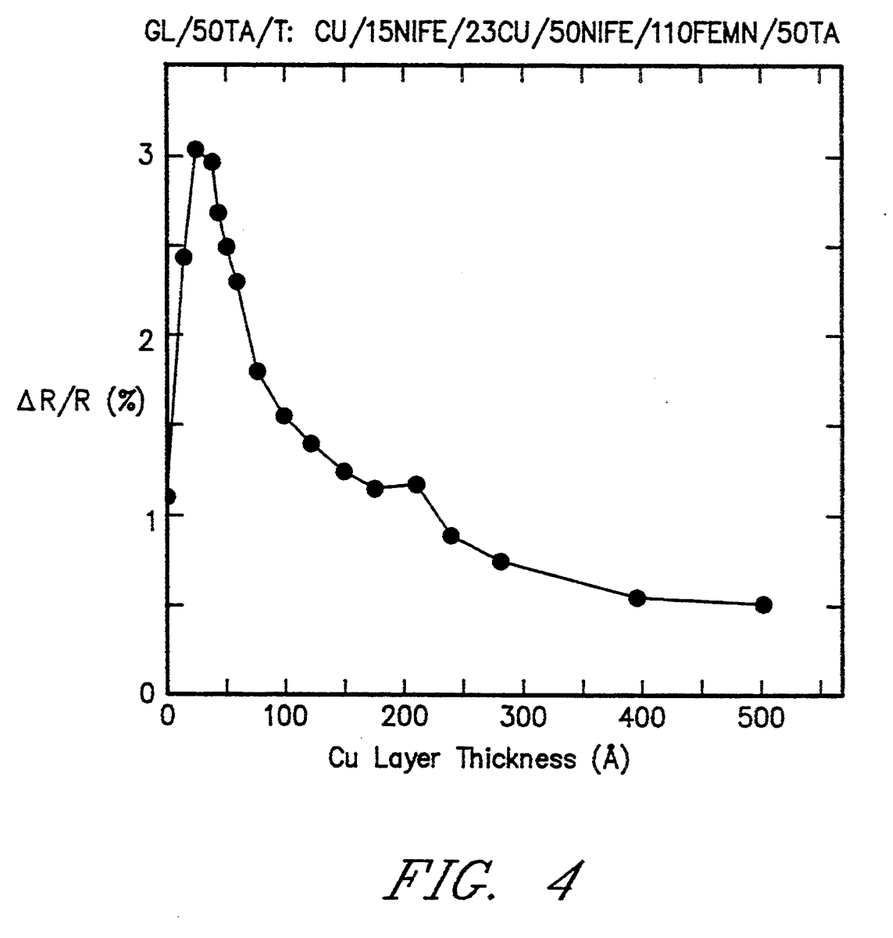
FIG. 4 is a graph which illustrates the magnetoresistive coefficient as a function of back layer thickness for a copper back layer in the magnetoresistive sensor shown in FIG. 2.
Figure 5:
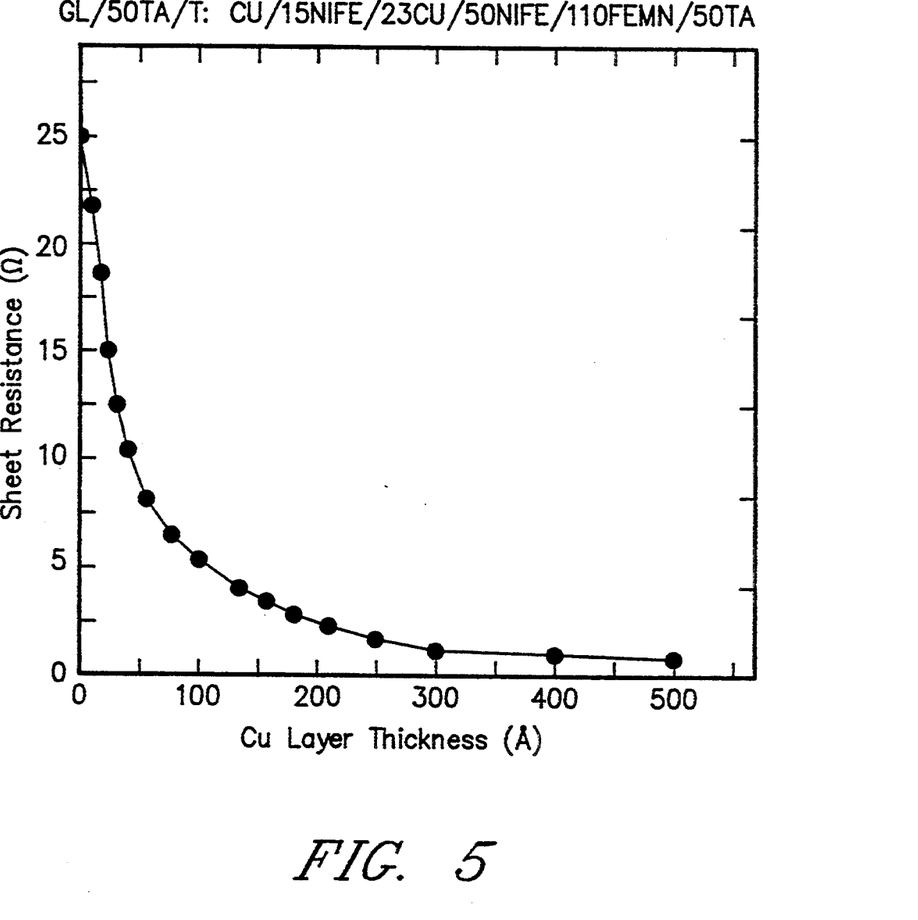
FIG. 5 is a graph which illustrates the sheet resistance of a copper back layer as a function of the back layer thickness in the magnetoresistive sensor shown in FIG. 2.

Referring now also to FIGS. 3A, 3B, 4 and 5, FIG. 3a illustrates the change in conductance (delta G approximately equal to deltaR/R$^2$) versus back layer 33 thickness for a particular embodiment of the spin valve structure shown in FIG. 2 deposited on a glass substrate having the structure 50 A Ta/t$_{Cu}$Cu/15 A NiFe/23 A Cu/50 A NiFe/110 A FeMn/50 A Ta. The first Ta layer is a buffer layer while the last Ta layer is a protective cap. The (t$_{Cu}$ Cu/15 A NiFe) comprises the free layer 33,35 having a back layer 33 of Cu and a filter layer 35 of NiFe. The MnFe layer comprises the bias layer 41 which provides antiferromagnetic exchange coupling to fix the magnetization of the pinned layer 39. As shown in FIG. 3A, the delta G increases with increasing back layer thickness, t$_{Cu}$, even though the back layer material is nonmagnetic. FIG. 3B illustrates delta G versus ferromagnetic layer thickness (the free layer) for a conventional spin valve structure without a nonmagnetic back layer behind the free layer deposited on a glass substrate and having the structure (t$_F$ F/22 A Cu/50 A NiFe/90 A FeMn) with F being Fe, NiFe or Co layers of varying thickness. Comparing FIG. 3A to FIG. 3B, it is clear that the use of a nonmagnetic back layer behind the free layer provides substantially increased delta G over that obtained for any of the three ferromagnetic materials without a back layer. FIG. 4 illustrates the magnetoresistance (deltaR/R) versus back layer thickness t$_{Cu}$ for the spin valve structure utilized for the measures shown in FIG. 3A. At t$_{Cu}$=0, deltaR/R=1.1%) with increasing t$_{Cu}$, deltaR/R rises sharply to a peak of 3% at t$_{Cu}$=25 A. For greater thickness, deltaR/R follows the well-known inverse-thickness dependence. FIG. 5 illustrates the sheet resistance R versus t$_{Cu}$ for the same structure. The sheet resistance follows the expected inverse-thickness dependence, ranging from 25 ohm/sq to 2.5 ohm/sq as t$_{Cu}$ increases from 0 to 150 A. This range is within acceptable limits for signal detection in an MR sensor.

Figure 6:
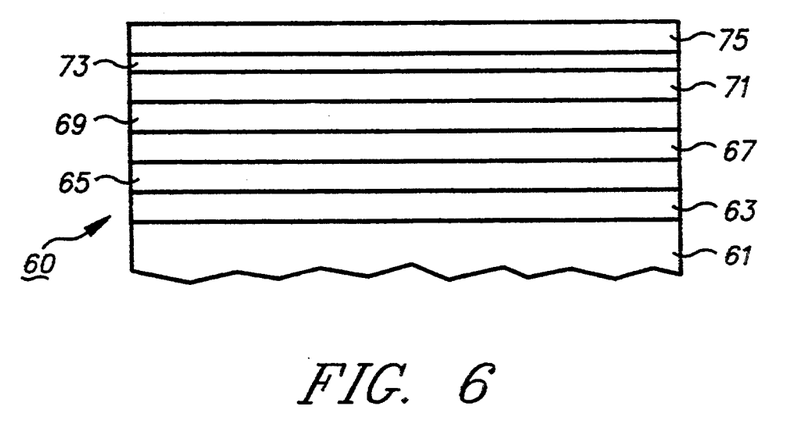
FIG. 6 is an end view of alternate embodiment of a magnetoresistive sensor constructed in accordance with the present invention.

Referring now also to FIG. 6, alternatively, the spin valve structure 30 shown in FIG. 2 can be deposited in reverse order; i.e., the magnetic bias or pinning layer of antiferromagnetic is deposited first, followed in order, by the pinned ferromagnetic layer, the nonmagnetic spacer layer and the free filter/back bilayer. A preferred embodiment of an inverted MR spin valve sensor 60 according to the present invention comprises an exchange bias layer 67 of antiferromagnetic material, a first ferromagnetic layer 69, a nonmagnetic metallic spacer layer 71, a second ferromagnetic layer 73 and a back layer 75 of a nonmagnetic conducting material deposited on a buffer layer 63 over a suitable substrate 61. As is known in the art, a protective capping layer (not shown) of high resistance material, such as Ta, for example, may be included overlaying the back layer 75 to minimize or prevent oxidation of the structure during subsequent processing steps and operation. As described above with reference to FIG. 2, the magnetization direction in the first ferromagnetic layer 69 is pinned or fixed in a preferred direction perpendicular to the magnetization direction in the free ferromagnetic layer 73 in the absence of an applied magnetic field. In the inverted spin valve structure 60, the back layer 75 is deposited after the pinned 69, spacer 71 and filter 73 layers; thus the properties of these layers remain independent of the thickness of and choice of material for the back layer 75. If necessary, a seed layer 65 can be deposited beneath the antiferromagnetic layer 67 to insure that the antiferromagnetic material has the desired structure.

In a specific preferred embodiment, the MR spin valve sensor 60 has the structure Ta(50 A)/NiFe(20 A)/Fe$_{60}$Mn$_{40}$(80 A)/Ni$_{80}$Fe$_{20}$(50 A)/Cu(23 A)/Ni$_{80}$Fe$_{20}$(20 A)/Cu(20 A)/Ta(30 A) deposited on a suitable substrate, where the 20 A Cu layer forms the back layer 75. The 50 ATa/20 ANiFe buffer/seed, 63/65, layer provides a template to properly grow the Fe$_{60}$Mn$_{40}$ material in an antiferromagnetic phase to provide exchange bias to pin the magnetization direction in the first ferromagnetic layer 69. In this preferred embodiment the thickness of the buffer layer 63 is in a range of about 30 A to 50 A; the thickness of the seed layer 65 is in a range of about 20 A to 50 A; the thickness of the exchange bias layer 67 is in a range of about 80 A to 120 A; and the range of the pinned ferromagnetic layer 69 is in a range of about 30 A to 100 A. As described above, the thickness of the spacer layer 71 is in a range of about 20 A to 40 A, but is preferably less than the mean free path for the conduction electrons in the spacer layer material. The thickness for the free ferromagnetic layer 73 is in a range of about 5 A to 30 A. The thickness of the nonmagnetic back layer 75 is determined, in part, by which parameter is being measured to detect an applied magnetic signal. If the change in resistance, i.e., deltaR/R, is being measured, the back layer 75 has a thickness in a range of about 4 A to 50 A. Alternatively, if the change in conductance is measured, the thickness of the back layer 75 is in a range of about 4 A to 1000 A.

Figure 7:
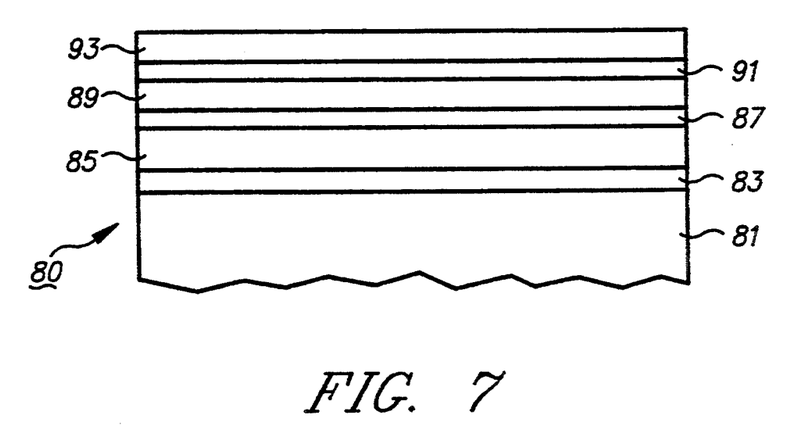
FIG. 7 is an end view of another embodiment of a magnetoresistive sensor constructed in accordance with the principles of the present invention.

Referring now also to FIG. 7, another preferred embodiment of the MR spin valve sensor according to the present invention comprises a first back layer 85 of a nonmagnetic conducting material, a first thin film layer 87 of magnetically soft ferromagnetic material, a thin film spacer layer 89 of a non-magnetic metallic material, a second thin film layer 91 of magnetically soft ferromagnetic material and a second back layer 95 of a nonmagnetic conducting material deposited over a buffer layer 83 on a suitable substrate 81 such as glass, ceramic or a semiconductor, for example. As is known in the art, a protective capping layer (not shown) of high resistance material, such as Ta, for example, may be included overlaying the second back layer 93 to minimize or prevent oxidation of the structure during operation and subsequent processing steps. When a sense current is applied to the MR sensor 80, the magnetic field associated with the sense current provides a bias field for each ferromagnetic layer 87, 91 such that the magnetization direction in each layer is oriented at equal and opposite angles with respect to the sensor magnetic easy axis. The direction of magnetization is not fixed in either of the ferromagnetic layers 87, 91 and, thus, is free to respond to an applied magnetic field. The first back layer and first ferromagnetic layer form a first bilayer. Similarly, the second back layer and the second ferromagnetic form a second bilayer. An applied magnetic signal will cause the magnetization direction in both bilayers, i.e., free layers, to rotate through substantially equal, but opposite angles with respect to the magnetic easy axis, thus having the effect of changing the angle between the magnetizations of the layers by twice as much compared to a spin valve structure in which one of the ferromagnetic layers is pinned. A current-biased MR spin valve sensor of this type is described in greater detail in U.S. patent application Ser. No. 07/977,382 filed on Nov. 17, 1992, now U.S. Pat. No. 5,301,079 assigned to the instant assignee, hereby incorporated by reference.

Figure 8:
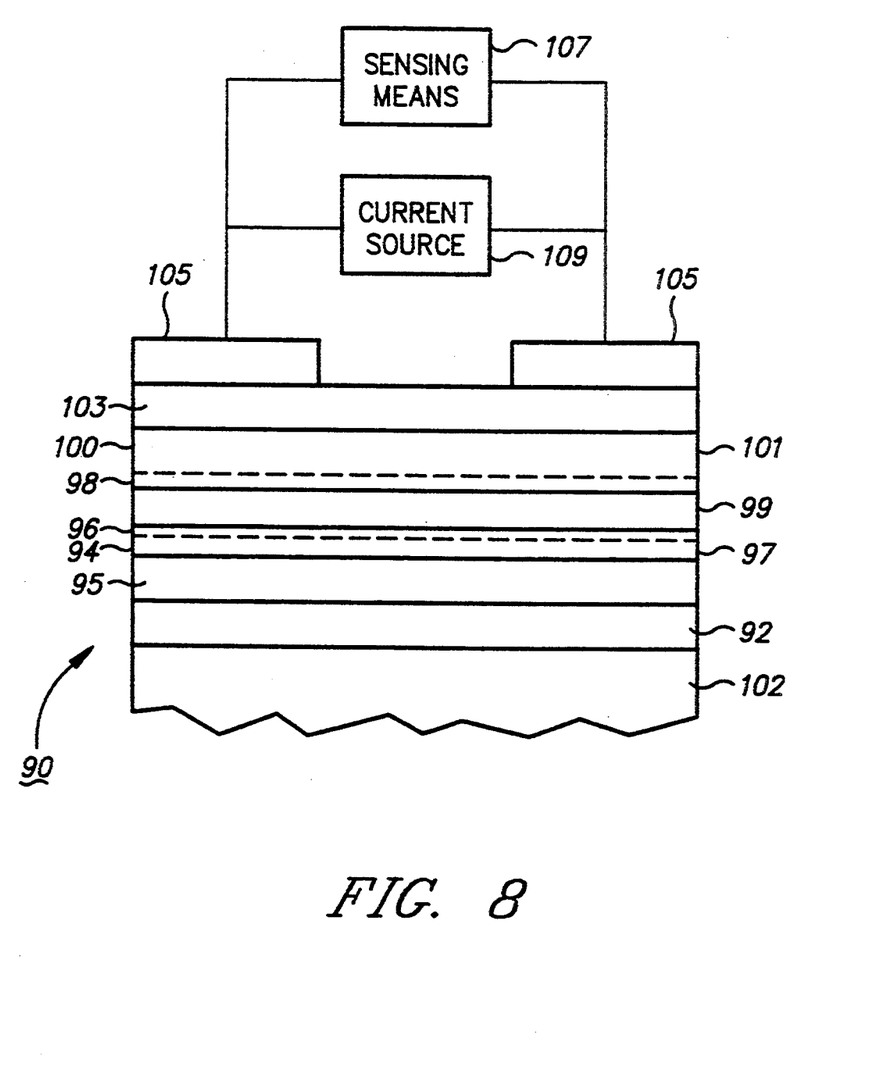
FIG. 8 is a schematic diagram illustrating a preferred embodiment of the magnetoresistive sensor shown in FIG. 2.

Referring now to FIG. 8, a further embodiment of the MR spin valve sensor shown in FIG. 2 is shown. A suitable underlayer 92, such as Ta, Ru or CrV, for example, is deposited on substrate 102 prior to the deposition of a back layer 95. The purpose of underlayer 92 is to optimize the texture, grain size and morphology of the subsequent layers. The morphology can be crucial in obtaining the large MR effects characteristic of spin valve structures since it permits the use of a very thin nonmagnetic metallic spacer layer 99 between the two ferromagnetic layers 97 and 101. The underlayer must also have a high resistivity to minimize electrical current shunting effects. The underlayer 92 is also used with the spin valve structures described above with reference to FIGS. 6 and 7, (i.e., buffer layers 63 and 83, respectively). Should the substrate 92 be of a material having a sufficiently high resistivity, have a sufficiently planar surface and have a suitable crystallographic structure, the underlayer 92 can be omitted.

A back layer 95 of nonmagnetic conducting material followed by a first thin film layer 97 of soft ferromagnetic material, a thin film layer 99 of a nonmagnetic metallic material, a second thin film layer 101 of a ferromagnetic material and a layer 103 of antiferromagnetic material are deposited over underlayer 92. The two ferromagnetic layers 97, 101 have their magnetizations oriented at an angle of approximately 90 degrees with respect to each other in the absence of an applied magnetic field. As described above, the magnetization direction of the second layer 101 of ferromagnetic material is pinned in position by a biasing field produced by exchange coupling. The back layer 95 and the first ferromagnetic layer 97 form a bilayer in which the magnetization is free to rotate in response to an applied magnetic field.

The ferromagnetic layers 97, 101 can be fabricated of any suitable magnetic material such as Co, Fe, Ni and their alloys such as NiFe, NiCo and FeCo, for example. The thicknesses of the pinned ferromagnetic layers 101 can be selected from a range of about 20 Å to about 150

Å. The exchange bias layer 103 can be of any suitable antiferromagnetic material such as NiMn or FeMn, for example, and is preferably of a thickness selected from a range of about 50 Å to about 150 Å. Alternately, the direction of magnetization in the pinned ferromagnetic layer 101 can be fixed by use of a hard magnetic bias layer or by use of a high coercivity magnetic material for the pinned layer or other suitable method as is known in the art.

The first or free ferromagnetic layer 97 which serves as the filter layer is preferably of a suitable NiFe or Co alloy and has a thickness selected from a range of about 5 Å to about 30 Å. The thickness of the filter layer 97 is primarily determined by its functions in the filter/back bilayer 95/97. As one purpose for the filter layer 97 is to block or filter out minority carriers, its minimum thickness should be greater that the mean free path for minority carriers; i.e., conduction electrons having a spin antiparallel to the direction of magnetization in the filter layer. For example, the lambda$^-$ for $NI_{80}Fe_{20}$ is less than approximately 7 A. Similarly, as another function of the filter layer is to transmit majority carriers through the layer to the back layer 95, its maximum thickness should be less than the mean free path for majority carriers; i.e., conduction electrons having a spin parallel to the direction of magnetization in the filter layer. For example, the lambda$^+$ for $NI_{80}Fe_{20}$ is approximately 50+/−4 A. The back layer 95 can be of any suitable nonmagnetic conducting material, preferably metallic having a relatively high conductivity (i.e., low resistivity). Noble metals such as Au, Ag, and Cu, for example, provide a large response. The thickness of the back layer 95 is determined by optimizing the sensor response depending on the sensing method utilized; i.e., the parameter being measured, deltaR, deltaR/R or delta G. For example, the magnitude of delta G increases sharply with back layer thickness up to thicknesses equal to two or three mean free path lengths for conduction electrons in the back layer material. In contrast, however, the response when measuring deltaR or deltaR/R is a peaked function of back layer thickness. In the preferred embodiment, where deltaR or deltaR/R is sensed, the back layer thickness is selected from a range of about 4 A to 60 A. If delta G is being sensed, the back layer thickness is selected from a range of about 4 A to about 1000 A.

The nonmagnetic spacer layer 99 is preferably metallic with high conductivity. Noble materials such as Au, Ag and Cu provide large MR response, Pt and Pd provide small MR response, while Cr and Ta exhibit very little MR response. The thickness of the metallic spacer layer 99 is sufficiently great to ensure substantial magnetic decoupling of the two ferromagnetic layers 97, 101 but still thin enough to be less than the mean free path length of the conduction electrons in the spacer layer material. The thickness of the spacer layer 99 is preferably within the range of about 10 Å to about 50 Å. While both the back layer 95 and the spacer layer 99 are of nonmagnetic, metallic materials having a high conductivity, it is not required that the back layer and the spacer layer be of the same material. Utilizing the same material, Cu for example, for both the back layer and the spacer layer reduces the complexity of the manufacturing process for fabricating the sensor. Alternatively, utilizing different materials for the back layer and the spacer layer provides additional flexibility for obtaining optimized or desired electrical and magnetic characteristics in the sensor.

A capping layer 103 of a high resistivity material such as Ta or Zr, for example, is then deposited over the MR sensor. Electrical leads 105 are provided to form a circuit path between the MR sensor and a current source 109 and a sensing means 107. As is well-known in the art, additional sensor elements, such as transverse and longitudinal bias layers (not shown) may be required to provide optimal MR sensor response circuit. In the preferred embodiment, a magnetic signal is sensed by the sensing means 107 by detecting the change in resistance, deltaR, of the MR element as the magnetization of the free layer 97 rotates in response to an applied magnetic signal. Alternatively, a magnetic signal can also be detected by sensing the change in the MR element conductance as the magnetization of the free layer 97 rotates in response to an applied magnetic signal. U.S. Pat. No. 4,712,144 issued to Klans B. Klaassen on Dec. 8, 1987, assigned to the instant assignee, describes in greater detail a sensing means to detect changes in the MR element conductance in response to an applied magnetic field.

In the preferred embodiments described above with reference to FIGS. 2, 6, 7 and 8, the ferromagnetic layers have been described generally as a single layer of a suitable ferromagnetic material. Alternatively, as shown in FIG. 8, one or both of the ferromagnetic layers 97, 101 can comprise multilayered structures having two or more layers wherein layers of different ferromagnetic or ferromagnetic and nonmagnetic materials can be alternatively laminated to buildup the ferromagnetic layers 97 and 101 having desired magnetic and electrical characteristics. For example, in a preferred embodiment the pinned ferromagnetic layer 101 comprises a first relatively thin layer 98 of Co, referred to as a nanolayer, and a second thin layer 100 of NiFe. In another preferred embodiment, both the free layer 97 and the pinned layer 101 comprise multilayered structures. The free ferromagnetic layer 97 comprises a nanolayer 96 of Co and a layer 94 of NiFe with the Co nanolayer formed adjacent the Cu spacer layer 99. Similarly, the pinned ferromagnetic layer 101 comprises a nanolayer 98 of Co and a layer 100 of NiFe with the Co nanolayer formed adjacent the Cu spacer layer 99. The thickness of the nanolayer is in a range of abut 0.5 A to 20 A. A spin valve MR sensor incorporating nanolayered ferromagnetic layers is described in greater detail in U.S. patent application Ser. No. 07/750,157, filed on Aug. 26, 1991, now U.S. Pat. No. 5,341,261 assigned to the instant assignee, hereby incorporated herein by reference. While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

We claim:

1. A magnetoresistive sensor comprising:
   a first and a second layer of ferromagnetic material separated by a spacer layer of nonmagnetic material, the magnetization direction of said first layer of ferromagnetic material being substantially perpendicular to the magnetization direction of said second layer of ferromagnetic material at zero applied magnetic field;

a back layer of nonmagnetic electrically conductive material adjacent to and in contact with said first ferromagnetic layer, said back layer being coextensive with said first ferromagnetic layer covering substantially the entire first ferromagnetic layer; and means for maintaining the magnetization in said second ferromagnetic layer in a desired direction.

2. A magnetoresistive sensor as in claim 1 wherein said means comprises an exchange bias layer of antiferromagnetic material adjacent to and in contact with said second ferromagnetic layer, said antiferromagnetic layer for providing a bias field in said second ferromagnetic layer for maintaining the magnetization in said second ferromagnetic layer in a desired direction.

3. A magnetoresistive sensor as in claim 2 wherein said antiferromagnetic layer is comprised of a material selected from the group consisting of iron-manganese and nickel-manganese.

4. A magnetoresistive sensor as in claim 3 wherein said antiferromagnetic layer is comprised of an alloy of iron-manganese.

5. A magnetoresistive sensor as in claim 2 wherein the thickness of said antiferromagnetic layer being within the range of about 50 angstroms to about 150 angstroms.

6. A magnetoresistive sensor as in claim 1 wherein the minimum thickness of said nonmagnetic back layer being about 4 angstroms.

7. A magnetoresistive sensor as in claim 6 wherein the maximum thickness of said nonmagnetic back layer being about three mean free path lengths for conduction electrons in said nonmagnetic back layer material.

8. A magnetoresistive sensor as in claim 6 wherein the thickness of said nonmagnetic back layer being within the range of about 4 angstroms to about 1000 angstroms.

9. A magnetoresistive sensor as in claim 6 wherein the thickness of said nonmagnetic back layer being within the range of about 4 angstroms to about 60 angstroms.

10. A magnetoresistive sensor as in claim 1 wherein the thickness of said first and said second ferromagnetic layers each being within the range of about 5 angstroms to about 150 angstroms.

11. A magnetoresistive sensor as in claim 10 wherein the thickness of said first ferromagnetic layer being within the range of about 5 angstroms to about 30 angstroms.

12. A magnetoresistive sensor as in claim 1 wherein said nonmagnetic spacer layer has a thickness less than the mean free path length of conduction electrons in said nonmagnetic spacer material.

13. A magnetoresistive sensor as in claim 12 wherein the thickness of said nonmagnetic spacer layer being within the range of about 10 angstroms to about 40 angstroms.

14. A magnetoresistive sensor as in claim 1 wherein said nonmagnetic spacer layer is comprised of a material selected from the group consisting of silver, gold, copper and alloys of silver, copper and gold.

15. A magnetoresistive sensor as in claim 14 wherein said nonmagnetic spacer layer comprises a thin film layer of copper.

16. A magnetoresistive sensor as in claim 1 where in said nonmagnetic back layer is comprised of a material selected from the group consisting of silver, gold and copper.

17. A magnetoresistive sensor as in claim 16 wherein said nonmagnetic back layer comprises a thin film layer of copper.

18. A magnetoresistive sensor as in claim 1 wherein at least one of said first and second ferromagnetic layers comprise a multilayered structure.

19. A magnetoresistive sensor as in claim 18 wherein said multilayered structure comprises at least one layer of a first ferromagnetic material and at least one layer of a second ferromagnetic material, said layers being alternatively laminated.

20. A magnetoresistive sensor as in claim 18 wherein said first ferromagnetic layer comprises a thin layer of cobalt and a thin layer of nickel-iron, said thin layer of cobalt formed adjacent said nonmagnetic spacer layer.

21. A magnetoresistive sensor as in claim 18 wherein said first and second ferromagnetic layers each comprise a thin layer of cobalt and a thin layer of nickel-iron, said thin layer of cobalt formed adjacent said nonmagnetic spacer layer.

22. A magnetoresistive sensor as in claim 21 wherein the thickness of said thin layer of cobalt being within the range of about 0.5 angstroms to about 20 angstroms.

23. A magnetoresistive sensor as in claim 1 wherein both said nonmagnetic back layer and said nonmagnetic spacer layer comprise the same nonmagnetic material.

24. A magnetoresistive sensor as in claim 1 wherein both said nonmagnetic back layer and said nonmagnetic spacer layer comprise different nonmagnetic materials.

25. A magnetic storage system comprising:
a magnetic storage medium having a plurality of tracks for recording of data;
a magnetic transducer maintained in a closely spaced position relative to said magnetic storage medium during relative motion between said magnetic transducer and said magnetic storage medium, said magnetic transducer including a magnetoresistive sensor comprising:
a first and a second layer of ferromagnetic material separated by a spacer layer of nonmagnetic material, the magnetization direction of said first layer of ferromagnetic material being substantially perpendicular to the magnetization direction of said second layer of ferromagnetic material at zero applied magnetic field;
a back layer of nonmagnetic electrically conductive material adjacent to and in contact with said first ferromagnetic layer, said back layer being coextensive with said first ferromagnetic layer covering substantially the entire first ferromagnetic layer; and
bias means for maintaining the magnetization in said second ferromagnetic layer in a desired direction;
actuator means coupled to said magnetic transducer for moving said magnetic transducer to selected tracks on said magnetic storage medium; and
detection means coupled to said magnetoresistive sensor for detecting resistance changes in said magnetoresistive sensor in response to magnetic fields intercepted by said magnetoresistive sensor, said magnetic fields representative of data bits recorded in said magnetic storage medium.

26. A magnetic storage system as in claim 25 wherein said bias means comprises an exchange bias layer of antiferromagnetic material adjacent to and in contact with said second ferromagnetic layer, said antiferromagnetic layer for providing a bias field in said second ferromagnetic layer for maintaining the magnetization in said second ferromagnetic layer in a desired direction.

27. A magnetic storage system as in claim 26 wherein said antiferromagnetic layer is comprised of a material selected from the group consisting of iron-manganese and nickel-manganese.

28. A magnetic storage system as in claim 26 wherein said magnetoresistive sensor further comprises:
- a capping layer deposited over said antiferromagnetic layer; and
- electrical lead means deposited over said capping layer for coupling said magnetoresistive sensor to said detection means.

29. A magnetic storage system as in claim 28 wherein said capping layer comprises a material selected from the group consisting of tantalum and zirconium.

30. A magnetic storage system as in claim 26 wherein said nonmagnetic spacer layer is comprised of a material selected from the group consisting of silver, gold, copper and alloys of silver, copper and gold.

31. A magnetic storage system as in claim 30 wherein said nonmagnetic spacer layer comprises a thin film layer of copper.

32. A magnetic storage system as in claim 25 where in said nonmagnetic back layer is comprised of a material selected from the group consisting of silver, gold and copper.

33. A magnetic storage system as in claim 32 wherein said nonmagnetic back layer comprises a thin film layer of copper.

34. A magnetoresistive sensor comprising:
- a first and a second layer of ferromagnetic material separated by a spacer layer of a nonmagnetic conductive material, the direction of magnetization in said first and second layers of ferromagnetic material responsive to a magnetic field generated by a sense current in said magnetoresistive sensor being oriented at equal and opposite angles with respect to the sensor magnetic easy axis;
- a first back layer of nonmagnetic electrically conductive material adjacent to and in contact with said first ferromagnetic layer, said first ferromagnetic layer disposed between said first back layer and said spacer layer, said first back layer being coextensive with said first ferromagnetic layer covering substantially the entire first ferromagnetic layer; and
- a second back layer of nonmagnetic electrically conductive material adjacent to and in contact with said second ferromagnetic layer, said second ferromagnetic layer disposed between said second back layer and said spacer layer, said second back layer being coextensive with said second ferromagnetic layer covering substantially the entire second ferromagnetic layer.

35. A magnetoresistive sensor as in claim 34 wherein the minimum thickness of said first and said second nonmagnetic back layers each being about 4 angstroms.

36. A magnetoresistive sensor as in claim 35 wherein the maximum thickness of said first and said second nonmagnetic back layers each being about three mean free path lengths for conduction electrons in said nonmagnetic back layer material, respectively.

37. A magnetoresistive sensor as in claim 35 wherein the thickness of said first and said second nonmagnetic back layers each being within the range of about 4 angstroms to about 1000 angstroms.

38. A magnetoresistive sensor as in claim 35 wherein the thickness of said first and said second nonmagnetic back layers each being within the range of about 4 angstroms to about 60 angstroms.

39. A magnetoresistive sensor as in claim 34 wherein the thickness of said first and said second ferromagnetic layers each being within the range of about 5 angstroms to about 30 angstroms.

40. A magnetoresistive sensor as in claim 34 wherein said nonmagnetic spacer layer has a thickness less than the mean free path length of conduction electrons in said nonmagnetic spacer material.

41. A magnetoresistive sensor as in claim 40 wherein the thickness of said nonmagnetic spacer layer being within the range of about 10 angstroms to about 40 angstroms.

42. A magnetoresistive sensor as in claim 34 wherein said nonmagnetic spacer layer is comprised of a material selected from the group consisting of silver, gold, copper and alloys of silver, copper and gold.

43. A magnetoresistive sensor as in claim 34 where in said first and second nonmagnetic back layers are comprised of a material selected from the group consisting of silver, gold and copper.

44. A magnetoresistive sensor as in claim 43 wherein said first and second nonmagnetic back layers each comprise a thin film layer of copper.

45. A magnetoresistive sensor comprising:
- a first and a second layer of ferromagnetic material separated by a spacer layer of nonmagnetic material, the direction of magnetization of said first layer of ferromagnetic material being substantially perpendicular to the direction of magnetization of said second layer of ferromagnetic material at zero applied magnetic field; and
- a back layer of nonmagnetic electrically conductive material adjacent to and in contact with said first layer of ferromagnetic material, said back layer being coextensive with said first ferromagnetic layer covering substantially the entire first ferromagnetic layer.

46. A magnetoresistive sensor as in claim 45, the minimum thickness of said nonmagnetic back layer being about 4 angstroms.

47. A magnetoresistive sensor as in claim 45, wherein said nonmagnetic back layer is comprised of a material selected from the group consisting of silver, gold and copper.

* * * * *